United States Patent
Thompson et al.

(10) Patent No.: US 9,753,094 B2
(45) Date of Patent: Sep. 5, 2017

(54) BATTERY PERFORMANCE UNDER HIGH TEMPERATURE EXPOSURE

(71) Applicant: Dell Products L.P., Round Rock, TX (US)

(72) Inventors: Richard C. Thompson, Cedar Park, TX (US); Wen-Yung Chang, Jhong Li (TW)

(73) Assignee: Dell Products L.P., Round Rock, TX (US)

( * ) Notice: Subject to any disclaimer, the term of this patent is extended or adjusted under 35 U.S.C. 154(b) by 316 days.

(21) Appl. No.: 14/504,683

(22) Filed: Oct. 2, 2014

(65) Prior Publication Data
US 2016/0097820 A1    Apr. 7, 2016

(51) Int. Cl.
*H02J 7/00* (2006.01)
*H02J 7/14* (2006.01)
*G01R 31/36* (2006.01)
*H02J 7/04* (2006.01)

(52) U.S. Cl.
CPC ........ *G01R 31/3675* (2013.01); *H02J 7/0008* (2013.01); *H02J 7/007* (2013.01); *H02J 7/0091* (2013.01); *H02J 7/047* (2013.01)

(58) Field of Classification Search
USPC ....... 320/134, 107, 150, 152, 118, 125, 127, 320/129, 136, 137, 162, 108, 116, 132, 320/149
See application file for complete search history.

(56) References Cited

U.S. PATENT DOCUMENTS

| | | | |
|---|---|---|---|
| 5,684,404 A | 11/1997 | Millar | |
| 6,188,202 B1* | 2/2001 | Yagi | H02J 7/0081 320/125 |
| 2006/0261816 A1 | 11/2006 | Rocher et al. | |
| 2009/0140698 A1* | 6/2009 | Eberhard | H02J 7/045 320/152 |
| 2011/0029265 A1 | 2/2011 | Martens | |
| 2012/0212184 A1* | 8/2012 | Klein | H01M 10/443 320/134 |
| 2013/0158915 A1 | 6/2013 | Humla | |
| 2014/0009123 A1* | 1/2014 | Park | G01R 31/361 320/152 |
| 2014/0077769 A1* | 3/2014 | Maleki | H02J 7/008 320/136 |
| 2014/0217958 A1 | 8/2014 | Verdun | |

(Continued)

FOREIGN PATENT DOCUMENTS

| | | |
|---|---|---|
| DE | 4316471 A1 | 11/1994 |
| WO | 2009093999 A1 | 7/2009 |
| WO | 2011041029 A1 | 4/2011 |

*Primary Examiner* — Alexis Pacheco
(74) *Attorney, Agent, or Firm* — Baker Botts L.L.P.

(57) ABSTRACT

A battery system for a portable information handling system may modify charging parameters based on temperature exposure of a battery. When the battery is charged and exposed to a high temperature, the battery may be discharged to a lower voltage. After a cumulative period of exposure to a high temperature, a top-of-charge (TOC) voltage may be permanently reduced for the battery. Prior to charging at a high temperature, the TOC voltage may be reduced for a next charge cycle. Reducing the TOC voltage may minimize adverse effects for battery performance.

17 Claims, 4 Drawing Sheets

(56) References Cited

U.S. PATENT DOCUMENTS

2014/0342191 A1\* 11/2014 Shin ..................... G06F 1/1635
  429/7
2014/0361738 A1\* 12/2014 Lee ........................ H02J 7/025
  320/108
2015/0048797 A1\* 2/2015 Song .................. G01R 31/3658
  320/134

\* cited by examiner

BATTERY PERFORMANCE UNDER HIGH TEMPERATURE EXPOSURE

BACKGROUND

Field of the Disclosure

This disclosure relates generally to portable information handling systems and, more particularly, to systems and methods for improved battery performance under high temperature exposure.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable devices such as notebook computers, media players, personal data assistants, digital cameras, cellular phones, cordless phones, smart phones, tablet computers, and 2-in-1 tablet-laptop combination computers. A portable device may generally be any device that a user may carry for handheld use and that includes a processor. Typically, portable devices may be powered using a rechargeable battery.

In certain instances, rechargeable batteries, such as included in a portable device, may experience accelerated performance degradation when subject to elevated temperatures.

SUMMARY

In one aspect, a disclosed method may be for charging a battery. When the battery is charged and the battery temperature is greater than a first temperature threshold, the method may include discharging the battery to a first voltage threshold. The first voltage threshold may be less than the top-of-charge voltage of the battery. When the battery temperature is greater than a second temperature threshold for a first duration, the method may include permanently reducing the top-of-charge voltage to a second voltage threshold. The second voltage threshold may be less than the maximum charge voltage of the battery.

In some embodiments, when the battery is discharged and a battery temperature is greater than a third temperature threshold, the method may include temporarily reducing a top-of-charge voltage to a third voltage threshold for a next charge cycle of the battery. The third voltage threshold may be less than a maximum charge voltage of the battery.

Other disclosed aspects include a battery system and an information handling system including the battery system.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

As noted previously, elevated temperatures may lead to accelerated performance degradation for rechargeable batteries used in information handling systems. As will be described in further detail, the inventors of the present disclosure have developed methods and systems disclosed herein for improved battery performance under high temperature exposure.

Particular embodiments are best understood by reference to FIGS. 1, 2A, 2B, 2C, 3, and 4 wherein like numbers are used to indicate like and corresponding parts.

Figure 1:
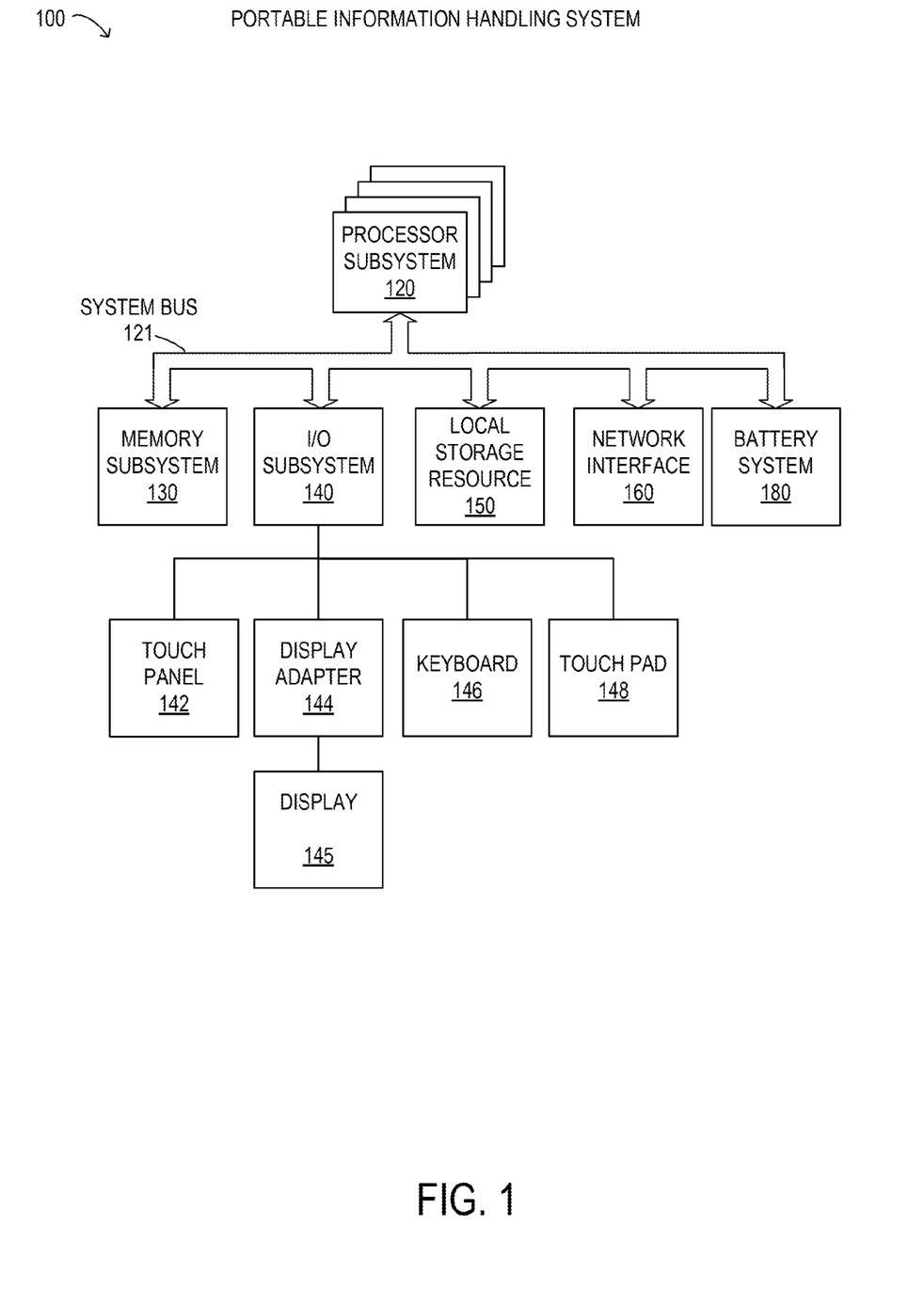
FIG. 1 is a block diagram of selected elements of an embodiment of an information handling system including a battery system.

Turning now to the drawings, FIG. 1 illustrates a block diagram depicting selected elements of an embodiment of portable information handling system 100. In various embodiments, portable information handling system 100 may represent different types of portable devices.

As shown in FIG. 1, components of portable information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network (not shown). Network interface 160 may enable information handling system 100 to communicate over the network using a suitable transmission protocol and/or standard, including, but not limited to, transmission protocols and/or standards enumerated below with respect to the discussion of network 155. In some embodiments, network interface 160 may be communicatively coupled via the network to a network storage resource (not shown). The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). The network coupled to network interface 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. The network coupled to network interface 160 and/or various components associated therewith may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in a network storage resource).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In portable information handling system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142, display adapter 144, keyboard 146, and touch pad 148. Touch panel 142 may include circuitry for enabling touch functionality in conjunction with display 145 that is driven by display adapter 144. Also shown included in portable information handling system 100 is battery system 180, which is described in further detail below with respect to FIG. 3. Portable information handling system 100 or battery system 180 may further include a charging element (not shown) for receiving external power and charging a battery included in battery system 180.

Thus, portable information handling systems, such as portable information handling system 100, may include battery system 180. Battery system 180 may be subject to degradation or physical damage when exposed to temperatures higher than an expected operating temperature.

As will be described in further detail herein, the inventors of the present disclosure have discovered methods and systems for improved battery performance under high temperature exposure. The methods and systems described herein may extend a lifetime of a battery exposed to higher temperatures. For example, a battery exposed to higher temperatures may be temporarily charged to a lower voltage than during a normal charge cycle for a healthy battery. Also, when a battery is fully charged and then exposed to a higher temperature, the battery may be discharged to a lower state of charge to reduce potential performance degradation to the battery. Additionally, a total time of exposure at a higher temperature may be monitored to ascertain whether a battery may have been permanently impaired or whether further exposure to the high temperature would lead to a permanently impaired battery, in which case, a top-of-charge voltage for the battery may be permanently reduced to a lower level than normally used.

Figure 2A:
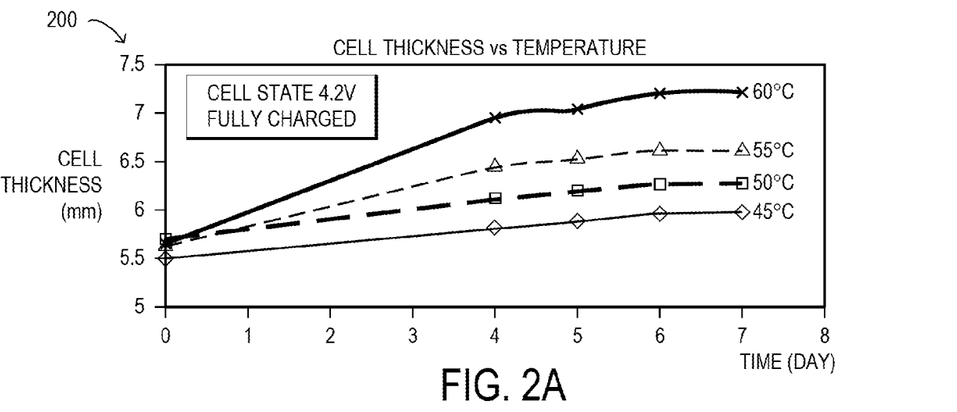
FIGS. 2A, 2B, and 2C are graphs of selected data of cell thickness of a battery system.
Figure 2B:
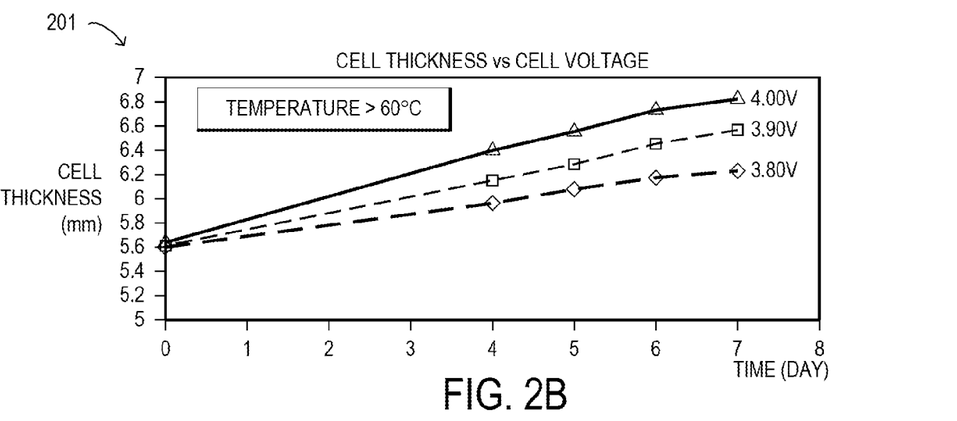
Figure 2C:
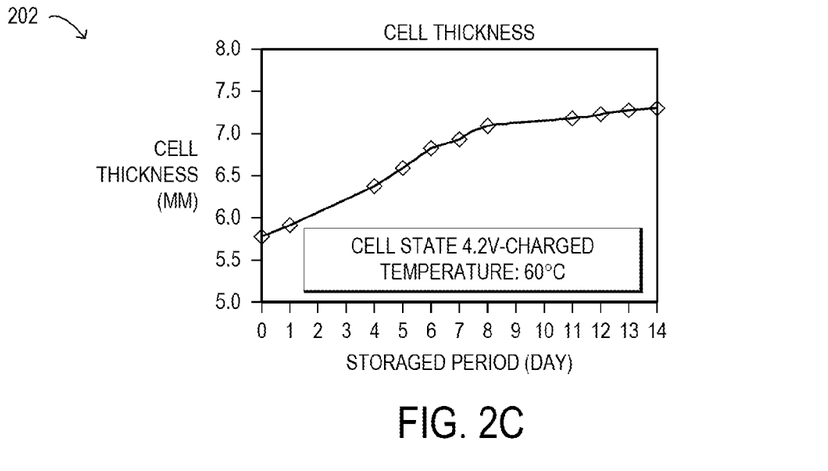

Referring now to FIGS. 2A, 2B, and 2C, respective graphs 200, 201, 202 of selected data of cell thickness of a battery system are shown. A battery chemistry of the battery for which data are shown in graphs 200, 201, 202 may be assumed to be a lithium-ion battery chemistry. Graphs 200, 201, 202 are presented to show how a cell thickness of a battery is affected by temperature and charge level of a battery. Cell thickness may increase due to chemical decomposition of a solvent used in the electrolyte, for example by evolution of $CO_2$ gas. Such increase in cell thickness, also referred to as cell swelling, may ultimately lead to failure of the battery and may indicate a damaged battery. It is noted that in different embodiments, the methods and systems described herein may be used with different battery chemistries, for example, by adapting actual parameters, such as voltages, voltage thresholds, temperatures, temperature thresholds, etc.

As used herein, a "top-of-charge voltage (TOC)" refers to a voltage threshold used during a charge cycle of a battery to determine a 100% charge level. It is noted that the top-of-charge voltage set on a given battery may be lower than a "maximum charge voltage", which, as used herein, specifies a maximum voltage that a given battery having a given battery chemistry is subject to during charging. As used herein a "state of charge (SOC)" or "charge level" refers to an actual charge level of a battery, from 0% to 100% for example, based on the currently applied top-of-charge voltage. The state of charge may be correlated to an actual voltage level of the battery, for example, depending on a particular battery chemistry.

In FIG. 2A, graph 200 shows cell thickness versus time of exposure to different temperatures for a fully charged battery having a TOC of 4.2V. In graph 200, cell thickness is shown to increase with increasing temperature, from 45° C. to 60° C. In FIG. 2B, graph 201 shows cell thickness versus time of exposure for different states of charge of a battery. The states of charge are shown as cell voltages. In graph 201, cell thickness is shown to increase with increasing cell voltage, from 3.80V to 4.00V. In FIG. 2C, graph 202 shows cell thickness versus time of exposure for a battery at 4.2 cell voltage and under a temperature of 60° C. In graph 202, cell thickness is shown to increase from less than 6.0 mm to greater than 7.0 mm.

Figure 3:
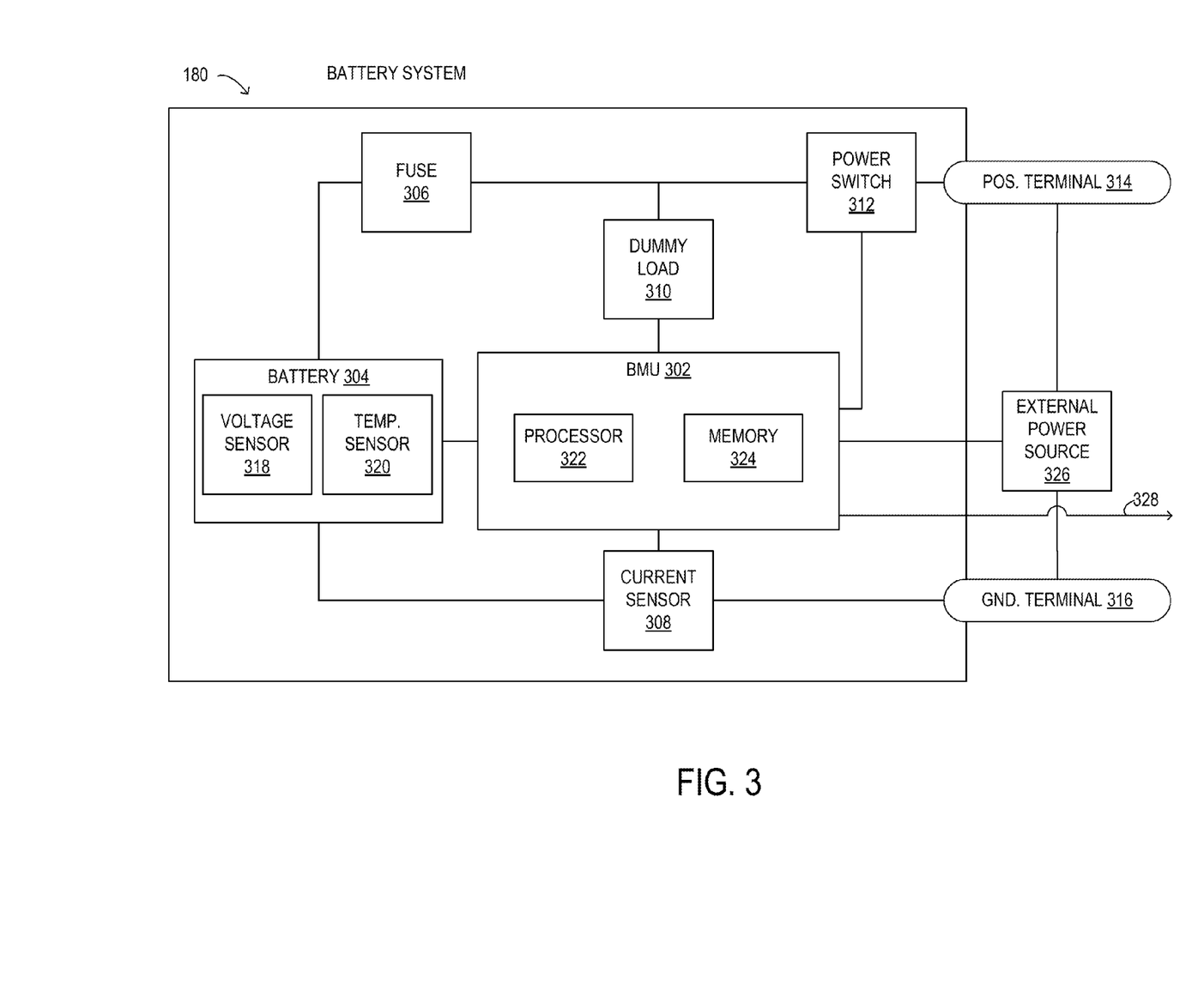
FIG. 3 is a block diagram of selected elements of an embodiment of a battery system.

Referring now to FIG. 3, selected elements of an embodiment of battery system 180 are depicted. The diagram of battery system 180 in FIG. 3 is schematic and shows certain functional elements. It is noted that in different embodiments, battery system 180 may include different elements and components. Battery system 180 may represent a rechargeable battery pack that is inserted into portable information handling system 100.

In FIG. 3, battery system 180 includes positive terminal 314 and negative terminal 316, which may represent external terminals for charging or discharging the battery to power an external load, such as portable information handling system 100 (see FIG. 1). In certain embodiments, battery system 180 is designed to mechanically couple to portable information handling system 100 such that positive terminal 314 and negative terminal 316 are electrically connected to the external load, for example, the electronic components of portable information handling system 100. Additionally, communication link 328 may enable battery system 180 to communicate with portable information handling system 100, for example, to output battery data collected locally at battery system 180. Also shown is external power source 326, which may represent a power source, or a power source connection, to battery system 180. In various embodiments, external power source 326 may represent an line power adapter that is coupled to battery system 180. In some embodiments, external power source 326 may be at least partially included within battery system 180.

Within battery system 180, a main power circuit across positive terminal 314 and negative terminal 316 may include current sensor 308, battery 304, fuse 306 and power switch 312. Current sensor 308 may represent a shunt resistor, or other current sensing element, over which a voltage that is directly proportional to the current flowing through the main power circuit is measured. Battery 304 may include the actual battery cells (not shown) that store and output electrical energy. Battery 304 may further include voltage sensor 318 and temperature sensor 320. Voltage sensor 318 may provide voltage values for individual battery cells, or an aggregate voltage for battery 304. Temperature sensor 320 may be located in proximity to the battery cells to provide an accurate indication of temperature exposure of battery 304. Fuse 306 may be a safety element for limiting current flowing through the main power circuit. Power switch 312 may be an electronically controlled switching element that closes or opens the main power circuit. Power switch 312 may also include switching functionality to switch other circuits across positive terminal 314 and negative terminal 316, such as dummy load 310, which may be an internal means for independently discharging battery 304 without relying on external loads across positive terminal 314 and negative terminal 316.

Also included in battery system 180 is battery management unit (BMU) 302, shown including processor 322 and memory 324. Memory 324 may store instructions executable by processor 322 to perform the methods described herein for improved battery performance under high temperature exposure (see also FIG. 4). Memory 324 may also store data, values, thresholds, and parameters related to the methods described herein for improved battery performance under high temperature exposure.

In operation, BMU 302 may control charging cycles for battery 304 and may apply a TOC voltage as a threshold to indicate when charging is complete when the battery voltage increases during charging. The TOC voltage may be lower than or equal to the maximum charge voltage that the battery can physically sustain. Depending on the actual value for the TOC voltage, a given energy capacity may be stored using battery 304. BMU 302 may further monitor other charging parameters, like charging current, voltage, and temperature for battery 304. In this manner, BMU 302 may be enabled to obtain various types of information associated with battery 304 and may make decisions according to the obtained information. As used herein, battery 304 may be considered to be discharged when a SOC corresponds to below a certain level of 100% charge level given by the TOC voltage, for example, such as below 5% charge level. Battery 304 may be considered to be charged when a SOC corresponds to above a certain level of 100% charge level given by the TOC voltage, for example, such as above 25% charge level. Battery 304 may be considered to be fully charged when above a certain level of 100% charge, such as above 95% charge level. Battery 304 may be considered to be at least partially discharged when below 100% charge level. The parameters for charge level describe here are exemplary and may be modified with different values in different embodiments.

Specifically, when battery 304 is charged and above a first temperature threshold, BMU 302 may discharge the battery to a lower voltage (i.e. lower SOC) less than the TOC voltage. The lower voltage or lower SOC may be specified by a first voltage threshold. When battery 304 has been exposed to a temperature above a second temperature threshold for longer than a given cumulative duration, the TOC voltage for battery 304 may be permanently reduced. The permanent reduction of the TOC voltage to a second voltage threshold may be performed whether battery 304 is charged or discharged. When battery 304 is discharged and a battery temperature is above a third temperature threshold, BMU 302 may temporarily reduce the TOC voltage from a previous value for a next charge cycle, that is, until battery 304 is charged above a given voltage level or to the new TOC voltage value. The temporarily reduced TOC voltage may be given by a third voltage threshold. Then, BMU 302 may reevaluate the temperature and SOC for battery 304 upon the next charge cycle. In this manner, various combinations of actions may be taken by BMU 302 depending on actual values selected for the first temperature threshold, the second temperature threshold, the third temperature threshold, the first voltage threshold, the second voltage threshold, and the third voltage threshold, along with elapsed time, the cumulative duration and other values. In one embodiment, a battery chemistry of the battery is a lithium-ion chemistry, and the first temperature threshold is 60° C., the second temperature threshold is 60° C., the third temperature threshold is 50° C., and the cumulative duration is 96 hours.

In some embodiments, the TOC voltages shown below in Table 1 may be used as voltage thresholds for various temperature ranges for a lithium-ion chemistry battery.

TABLE 1

Charge voltages for different temperature ranges.

| Charge Temperature Range [° C.] | Charge Voltage (TOC voltage) [V] |
|---|---|
| 0-50° C. | 4.20 V |
| 50-63° C. | 4.00 V |
| 63-71° C. | 3.75 V |

It is noted that, in certain embodiments, battery system 180, which may have access to network interface 160 via system bus 121, as shown in FIG. 1, may communicate with a central server (not shown) for management of charging parameters and charging functionality. Specifically, battery system 180 may comprise a unique identifier that is used by the central server to record information associated with battery system 180. When battery system 180 is accessible via a network to the central server, BMU 302 may communicate battery parameters and other instructions to and from the central server, such as described herein for improved battery performance under high temperature exposure. In this manner, the central server may accumulate a large database of stored values for actual batteries in service and may accordingly provide optimized or desired values, such as the various threshold values described herein, to a given instance of battery system 180. It is further noted that BMU 302 may continue adapt and modify the various parameters, such as threshold values, described herein during operation of battery system 180. For example, BMU 302 may modify certain threshold values depending on a service age of battery system 180, given by a total duration in service.

Figure 4:
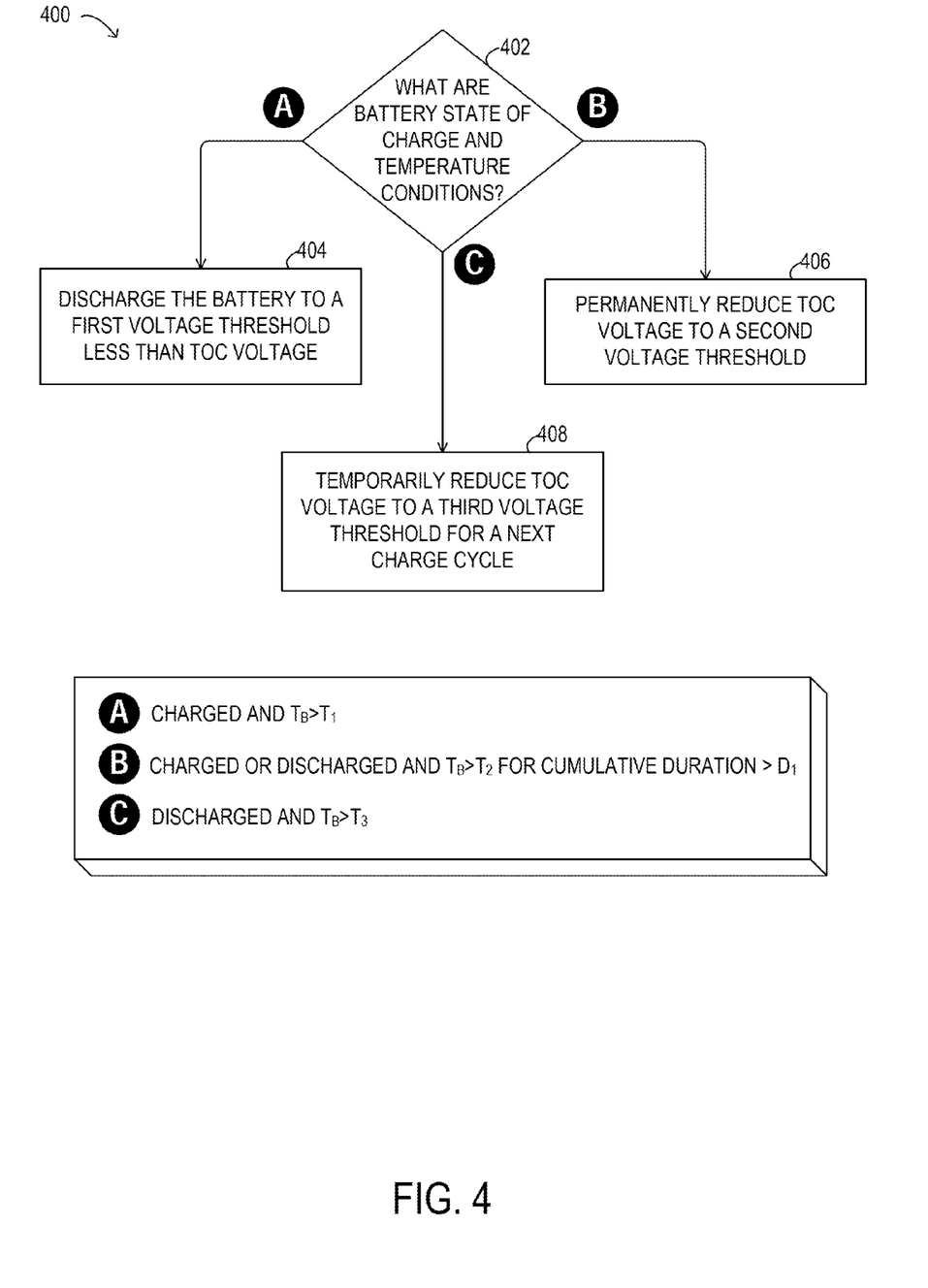
FIG. 4 is flowchart depicting selected elements of an embodiment of a method for improved battery performance under high temperature exposure.

Referring now to FIG. 4, a block diagram of selected elements of an embodiment of method 400 for improved battery performance under high temperature exposure is depicted in flowchart form. Method 400 may be performed by battery system 180 in portable information handling system 100 (see FIGS. 1 and 3) and specifically, by BMU 302. It is noted that certain operations described in method 400 may be optional or may be rearranged in different embodiments.

In FIG. 4, method 400 may begin with a determination (operation 402) of what the battery state of charge and temperature conditions are. It is noted that the results of operation 402 may occur in any order, in various embodiments. When the battery is charged and a battery temperature $T_B$ is greater than a first temperature threshold $T_1$ (result A of operation 402), the battery may be discharged (operation 404) to a second voltage threshold less than the TOC voltage. The battery may be discharged using an internal dummy load or using an external load or combinations thereof. In certain embodiments, when the battery is under an external power source, which would normally power the battery, discharging in operation 404 may include switching off the external power source and discharging the battery from usage of the portable information handling system. In another example, when portable information handling system 100 is powered off, the internal dummy load may be used to discharge the battery. When the battery is charged or discharged and a battery temperature $T_B$ is greater than a second temperature threshold $T_2$ for a cumulative duration greater than a first duration $D_1$ (result B of operation 402), TOC may be permanently reduced (operation 406) to a second voltage threshold. When the battery is discharged and a battery temperature $T_B$ is greater than a third temperature threshold $T_3$ (result C of operation 402), TOC voltage may be temporarily reduced (operation 408) to a third voltage threshold for a next charge cycle.

As disclosed herein, a battery system for a portable information handling system may modify charging parameters based on temperature exposure of a battery. When the battery is charged and exposed to a high temperature, the battery may be discharged to a lower voltage. After a cumulative period of exposure to a high temperature, a top-of-charge (TOC) voltage may be permanently reduced for the battery. Prior to charging at a high temperature, the TOC voltage may be reduced for a next charge cycle. Reducing the TOC voltage may minimize adverse effects for battery performance.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for charging a battery, comprising:
   when the battery is charged and the battery temperature is greater than a first temperature threshold, discharging the battery to a first voltage threshold, wherein the first voltage threshold is less than a top-of-charge voltage of the battery; and
   when the battery temperature is greater than a second temperature threshold for a first duration, permanently reducing the top-of-charge voltage to a second voltage threshold, wherein the second voltage threshold is less than a maximum charge voltage of the battery, and wherein the first temperature threshold and the second temperature threshold are determined based at least in part on a battery chemistry of the battery.

2. The method of claim 1, wherein the first voltage threshold and the second voltage threshold are determined based at least in part on a battery chemistry and a service age of the battery.

3. The method of claim 1, wherein discharging the battery to the first voltage threshold includes switching a dummy load to output terminals of the battery.

4. The method of claim 1, wherein discharging the battery to the first voltage threshold includes switching off an external power source to the battery.

5. The method of claim 1, wherein a discharged battery is at less than 5% of a state of charge corresponding to the top-of-charge voltage, and wherein a charged battery is at greater than 25% of the state of charge corresponding to the top-of-charge voltage.

6. The method of claim 1, wherein a battery chemistry of the battery is a lithium-ion chemistry, and wherein the first temperature threshold and the second temperature threshold are 60° C., and the first duration is a cumulative duration of 96 hours.

7. A battery system comprising:
   a battery; and
   a battery management unit comprising a processor and memory media, the memory media storing instructions executable by the processor to:
      when the battery is charged and the battery temperature is greater than a first temperature threshold, discharge the battery to a first voltage threshold, wherein the first voltage threshold is less than a top-of-charge voltage of the battery; and
      when the battery temperature is greater than a second temperature threshold for a first duration, permanently reduce the top-of-charge voltage to a second voltage threshold, wherein the second voltage threshold is less than a maximum charge voltage of the battery, and wherein the first temperature threshold and the second temperature threshold are determined based at least in part on a battery chemistry of the battery.

8. The battery system of claim 7, wherein the first voltage threshold and the second voltage threshold are determined based at least in part on a battery chemistry and a service age of the battery.

9. The battery system of claim 7, wherein the instructions to discharge the battery to the first voltage threshold include instructions to switch a dummy load to output terminals of the battery.

10. The battery system of claim 7, wherein the instructions to discharge the battery to the first voltage threshold include instructions to switch off an external power source to the battery.

11. The battery system of claim 7, wherein a discharged battery is at less than 5% of a state of charge corresponding to the top-of-charge voltage, and wherein a charged battery is at greater than 25% of the state of charge corresponding to the top-of-charge voltage.

12. The battery system of claim 7, wherein a battery chemistry of the battery is a lithium-ion chemistry, and wherein the first temperature threshold and the second temperature threshold are 60° C., and the first duration is a cumulative duration of 96 hours.

13. An information handling system, comprising:
   a battery system, the battery system comprising:
      a battery; and
      a battery management unit comprising a processor and memory media, the memory media storing instructions executable by the processor to:
         when the battery is charged and the battery temperature is greater than a first temperature threshold, discharge the battery to a first voltage threshold, wherein the first voltage threshold is less than a top-of-charge voltage of the battery; and
         when the battery temperature is greater than a second temperature threshold for a first duration, permanently reduce the top-of-charge voltage to a second voltage threshold, wherein the second voltage threshold is less than a maximum charge voltage of the battery, and wherein the first temperature threshold and the second temperature threshold are determined based at least in part on a battery chemistry of the battery.

14. The information handling system of claim 13, wherein the first voltage threshold and the second voltage threshold are determined based at least in part on a battery chemistry and a service age of the battery.

15. The information handling system of claim 13, wherein the instructions to discharge the battery to the first voltage threshold include instructions to switch a dummy load to output terminals of the battery.

16. The information handling system of claim 13, wherein the instructions to discharge the battery to the first voltage threshold include instructions to switch off an external power source to the battery.

17. The information handling system of claim 13, wherein a discharged battery is at less than 5% of a state of charge corresponding to the top-of-charge voltage, wherein a charged battery is at greater than 25% of the state of charge corresponding to the top-of-charge voltage, wherein a battery chemistry of the battery is a lithium-ion chemistry, and wherein the first temperature threshold and the third temperature threshold are 60° C., and the first duration is a cumulative duration of 96 hours.

\* \* \* \* \*